US009324841B2

United States Patent
Yu et al.

(10) Patent No.: US 9,324,841 B2
(45) Date of Patent: Apr. 26, 2016

(54) METHODS FOR PREVENTING OXIDATION DAMAGE DURING FINFET FABRICATION

(71) Applicant: GLOBALFOUNDRIES Inc., Grand Cayman (KY)

(72) Inventors: Hong Yu, Rexford, NY (US); Hyucksoo Yang, Saratoga Springs, NY (US); Huang Liu, Mechanicville, NY (US); Richard J. Carter, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/049,848

(22) Filed: Oct. 9, 2013

(65) Prior Publication Data
US 2015/0099340 A1 Apr. 9, 2015

(51) Int. Cl.
| | |
|---|---|
| H01L 21/20 | (2006.01) |
| H01L 21/336 | (2006.01) |
| H01L 29/76 | (2006.01) |
| H01L 29/66 | (2006.01) |

(52) U.S. Cl.
CPC ...... *H01L 29/66795* (2013.01); *H01L 29/6653* (2013.01)

(58) Field of Classification Search
USPC ............... 257/288, 192, 197, 183, 401, 381, 257/E21.197; 438/279, 585, 591
See application file for complete search history.

(56) References Cited

U.S. PATENT DOCUMENTS

| | | | |
|---|---|---|---|
| 5,530,293 A * | 6/1996 | Cohen et al. | 257/752 |
| 2001/0042799 A1 * | 11/2001 | Kim et al. | 239/553 |
| 2005/0026443 A1 * | 2/2005 | Goo et al. | 438/694 |
| 2008/0042219 A1 | 2/2008 | Booth, Jr. et al. | |
| 2010/0207245 A1 * | 8/2010 | Cheng et al. | 257/532 |
| 2010/0267223 A1 * | 10/2010 | Yang | 438/503 |
| 2010/0285630 A1 * | 11/2010 | Lee | 438/70 |
| 2011/0049630 A1 * | 3/2011 | Majumdar et al. | 257/351 |
| 2011/0136319 A1 * | 6/2011 | Ho et al. | 438/437 |
| 2011/0303983 A1 | 12/2011 | Basker et al. | |
| 2012/0009753 A1 * | 1/2012 | Matsumoto | 438/300 |
| 2013/0221317 A1 * | 8/2013 | Pramanik et al. | 257/5 |
| 2013/0234215 A1 * | 9/2013 | Okano | 257/255 |

OTHER PUBLICATIONS

Togo et al. "Phosphorus Doped SiC Source Drain and SiGe Channel for Scaled Bulk FinFETs" International Electron Devices Meeting—IEDM pp. 18,2 2012.*

* cited by examiner

*Primary Examiner* — Calvin Choi
*Assistant Examiner* — Xiaoming Liu
(74) *Attorney, Agent, or Firm* — Williams Morgan, P.C.

(57) ABSTRACT

Embodiments of the present invention provide improved methods for fabricating field effect transistors such as finFETs. Stressor regions are used to increase carrier mobility. However, subsequent processes such as deposition of flowable oxide and annealing can damage the stressor regions, diminishing the amount of stress that is induced. Embodiments of the present invention provide a protective layer of silicon or silicon oxide over the stressor regions prior to the flowable oxide deposition and anneal.

20 Claims, 8 Drawing Sheets

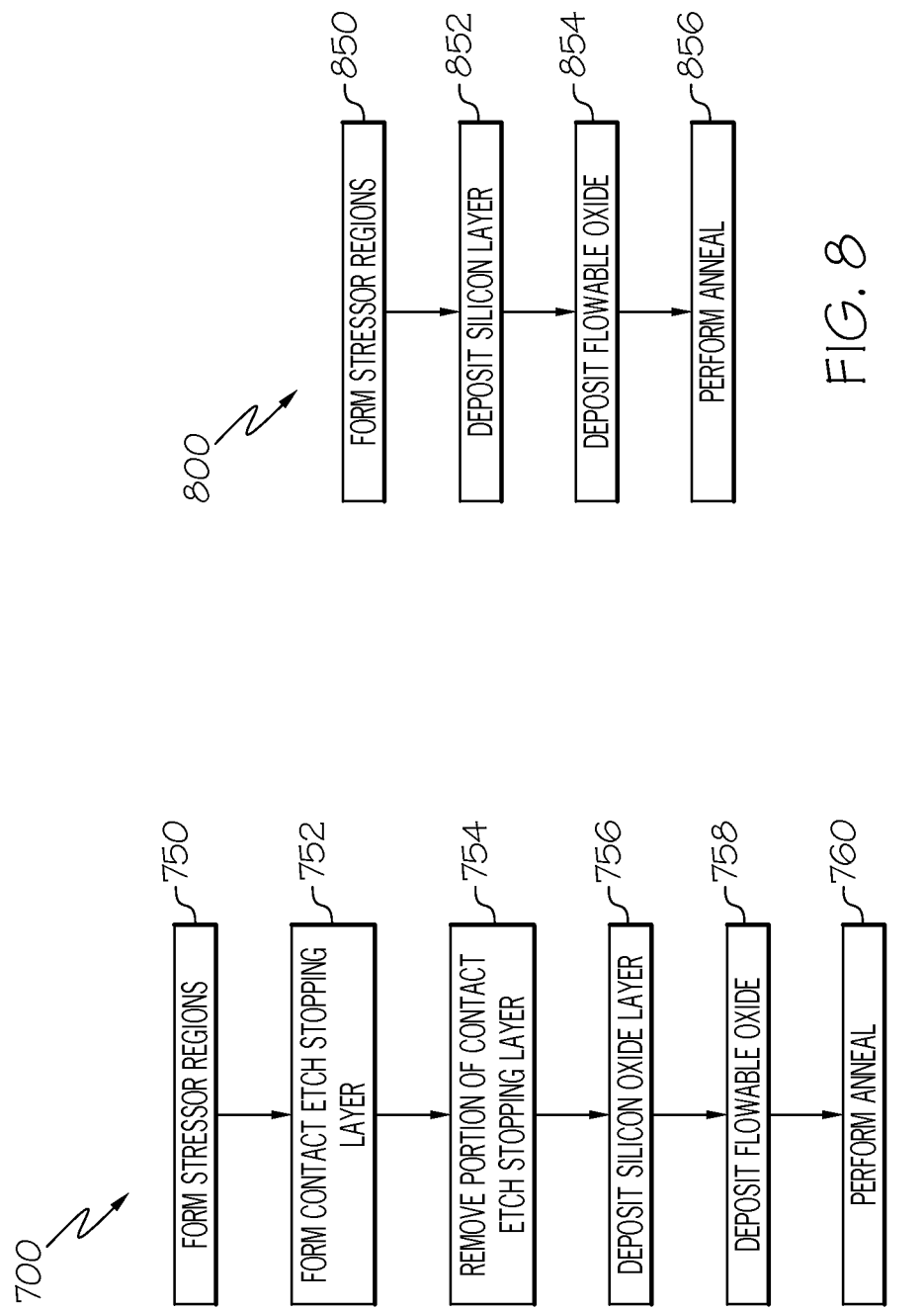

US 9,324,841 B2

METHODS FOR PREVENTING OXIDATION DAMAGE DURING FINFET FABRICATION

FIELD OF THE INVENTION

The present invention relates generally to semiconductor fabrication and, more particularly, to methods for preventing oxidation damage during finFET fabrication.

BACKGROUND

FinFETs (Fin field-effect-transistors) are a technology which allows smaller and higher performance devices. FinFET structures comprise narrow isolated bars of silicon (fins) with a gate(s) on the top and the sides of the fin. With the continuing trend towards miniaturization of integrated circuits (ICs), there is a need for transistors having higher performance. Furthermore, with large quantities of ICs being produced, product yield becomes increasingly important. It is therefore desirable to have improved methods of fabrication for finFET devices.

SUMMARY OF THE INVENTION

In a first aspect, embodiments of the present invention provide a method of forming a semiconductor structure, comprising: forming a plurality of stressor regions adjacent to a gate; forming a contact etch stopping layer on the gate and plurality of stressor regions; removing the contact etch stopping layer from a top portion of the gate and plurality of stressor regions; depositing a silicon layer on the gate and plurality of stressor regions; depositing a flowable oxide on the plurality of stressor regions; and performing an anneal on the semiconductor structure.

In a second aspect, embodiments of the present invention provide a method of forming a semiconductor structure, comprising: forming a plurality of stressor regions adjacent to a gate; forming a contact etch stopping layer on the gate and plurality of stressor regions; removing the contact etch stopping layer from a top portion of the gate and plurality of stressor regions; depositing a silicon oxide layer on the gate and plurality of stressor regions; depositing a flowable oxide on the plurality of stressor regions; and performing an anneal on the semiconductor structure.

In a third aspect, embodiments of the present invention provide a method of forming a semiconductor structure, comprising: forming a plurality of stressor regions adjacent to a gate; forming a contact etch stopping layer of silicon nitride on the gate and plurality of stressor regions using an atomic layer deposition process; removing the contact etch stopping layer from a top portion of the gate and plurality of stressor regions; depositing a silicon oxide layer on the gate and plurality of stressor regions; depositing a flowable oxide on the plurality of stressor regions; and performing an anneal on the semiconductor structure.

BRIEF DESCRIPTION OF THE DRAWINGS

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity. Furthermore, for clarity, some reference numbers may be omitted in certain drawings.

Often, similar elements may be referred to by similar numbers in various figures (FIGs) of the drawing, in which case typically the last two significant digits may be the same, the most significant digit being the number of the drawing figure (FIG.).

Figure 1A:
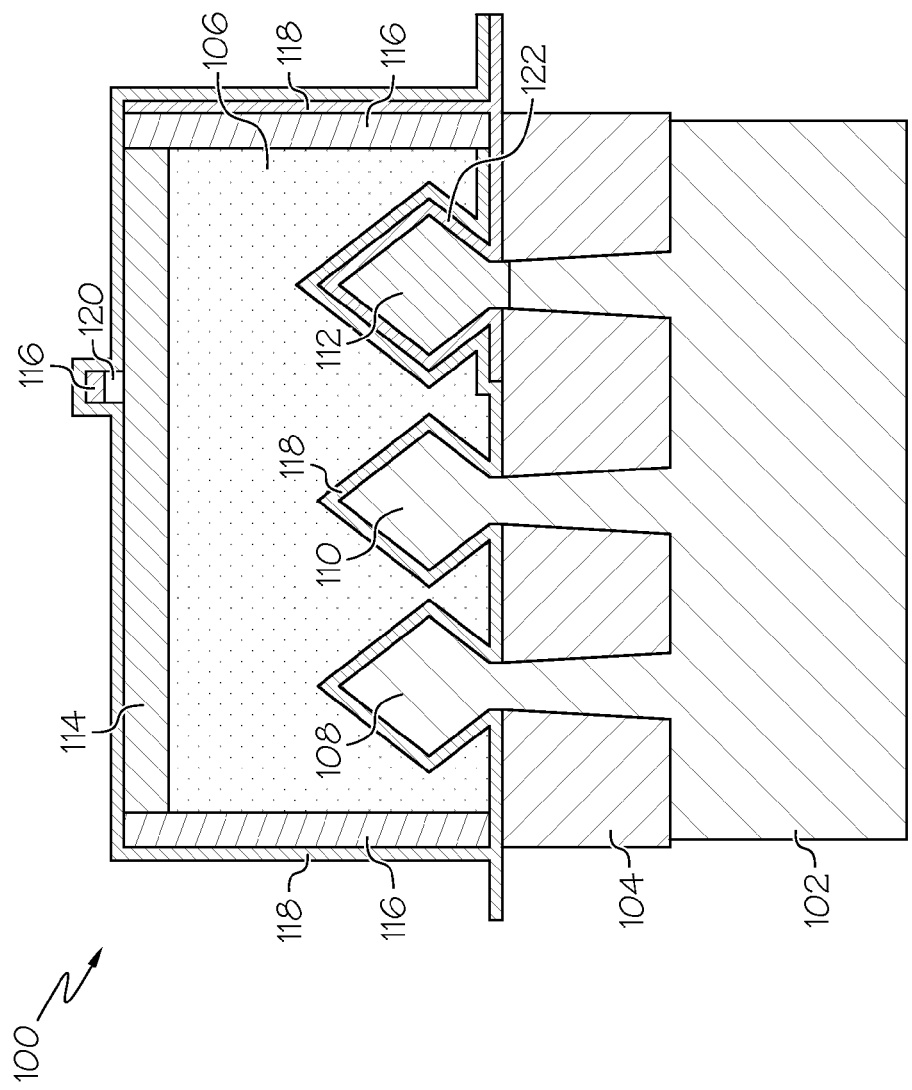
Figure 1B:
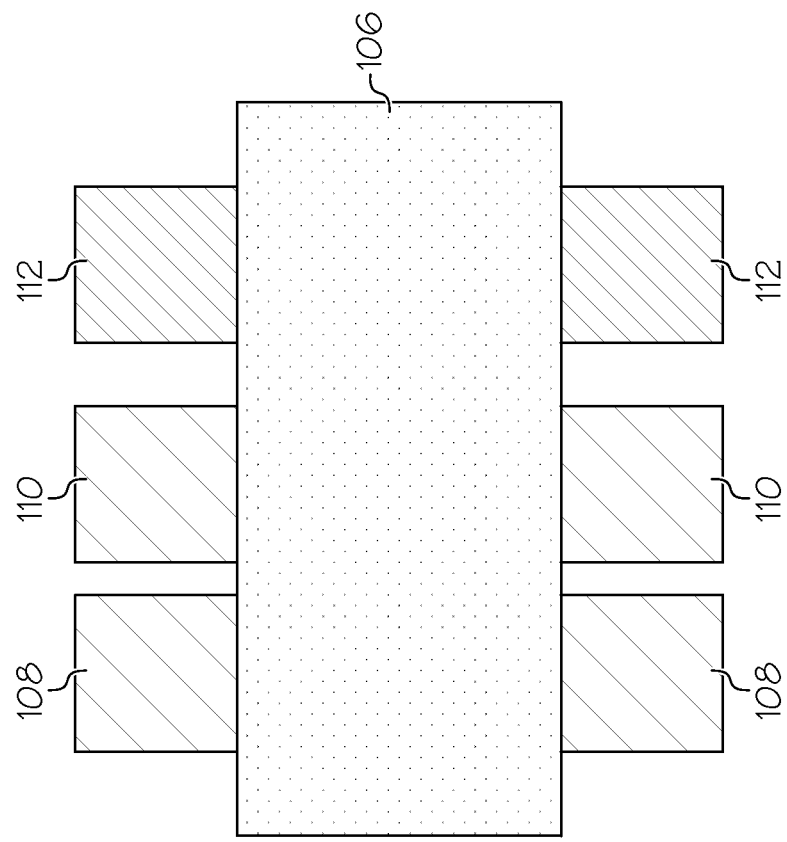
Figure 2:
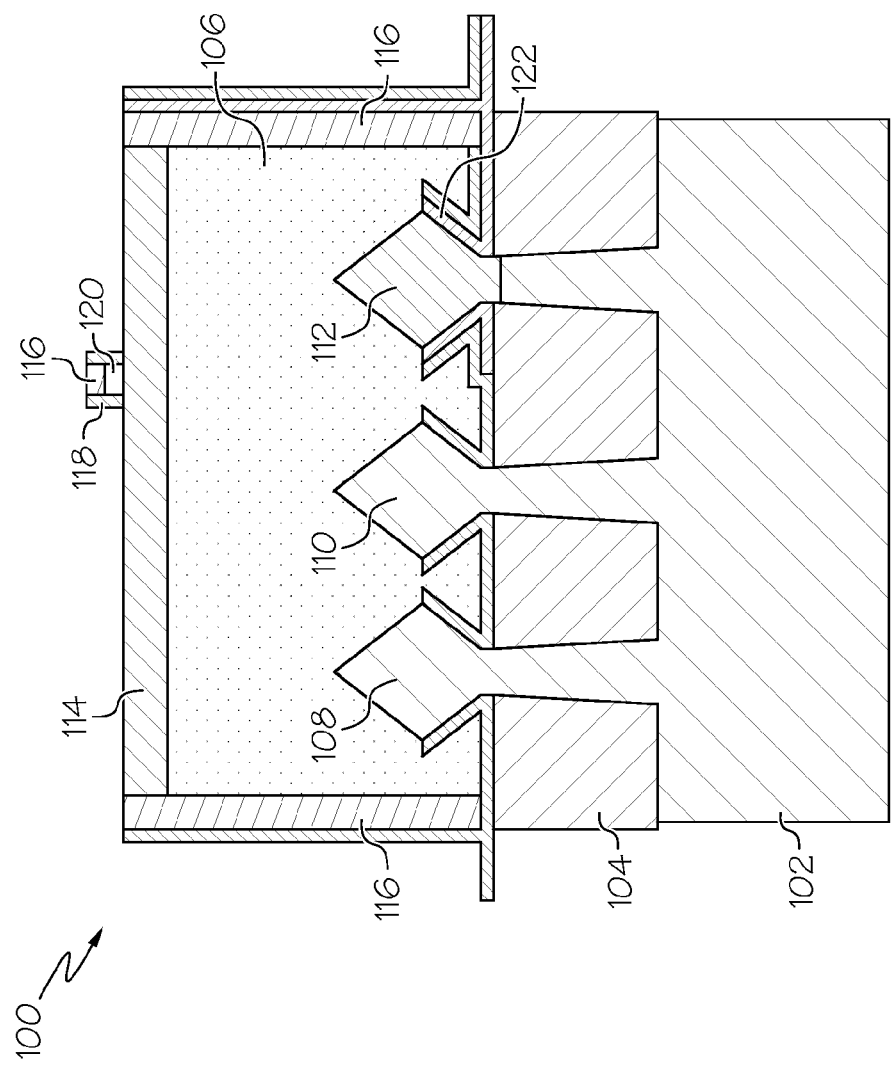
Figure 3:
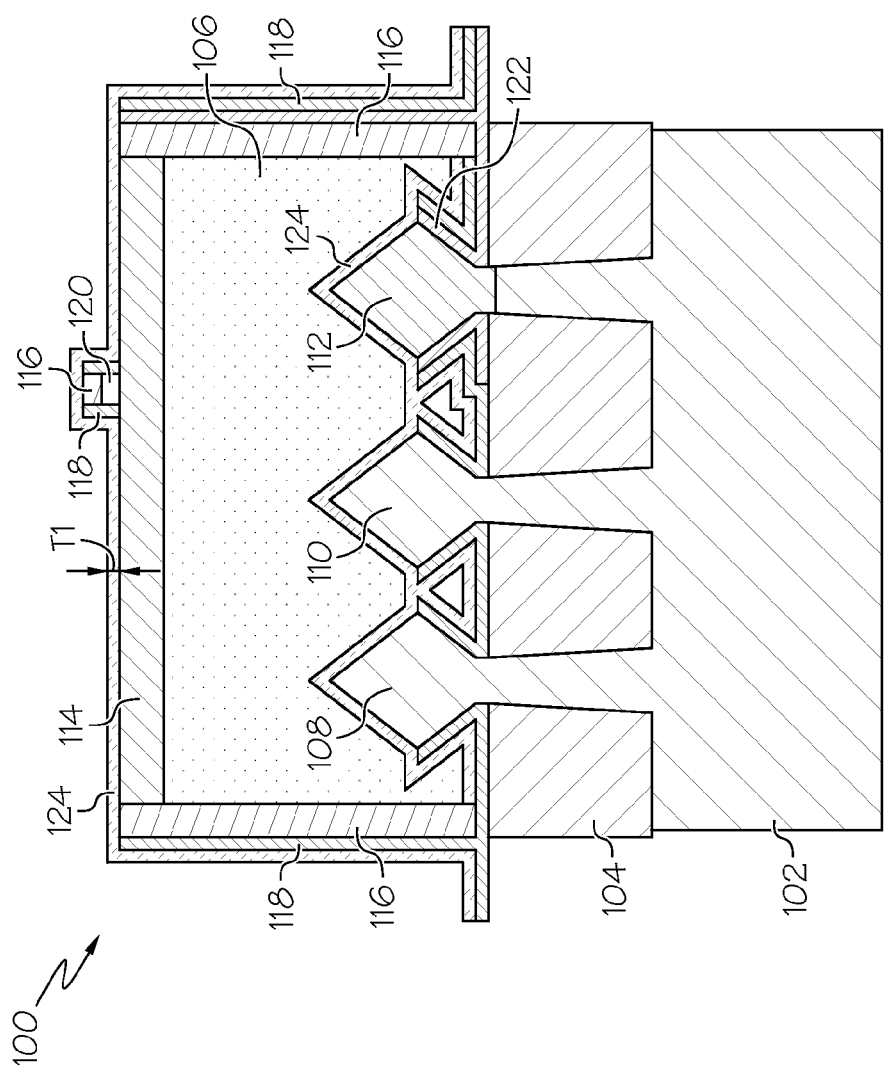
Figure 4:
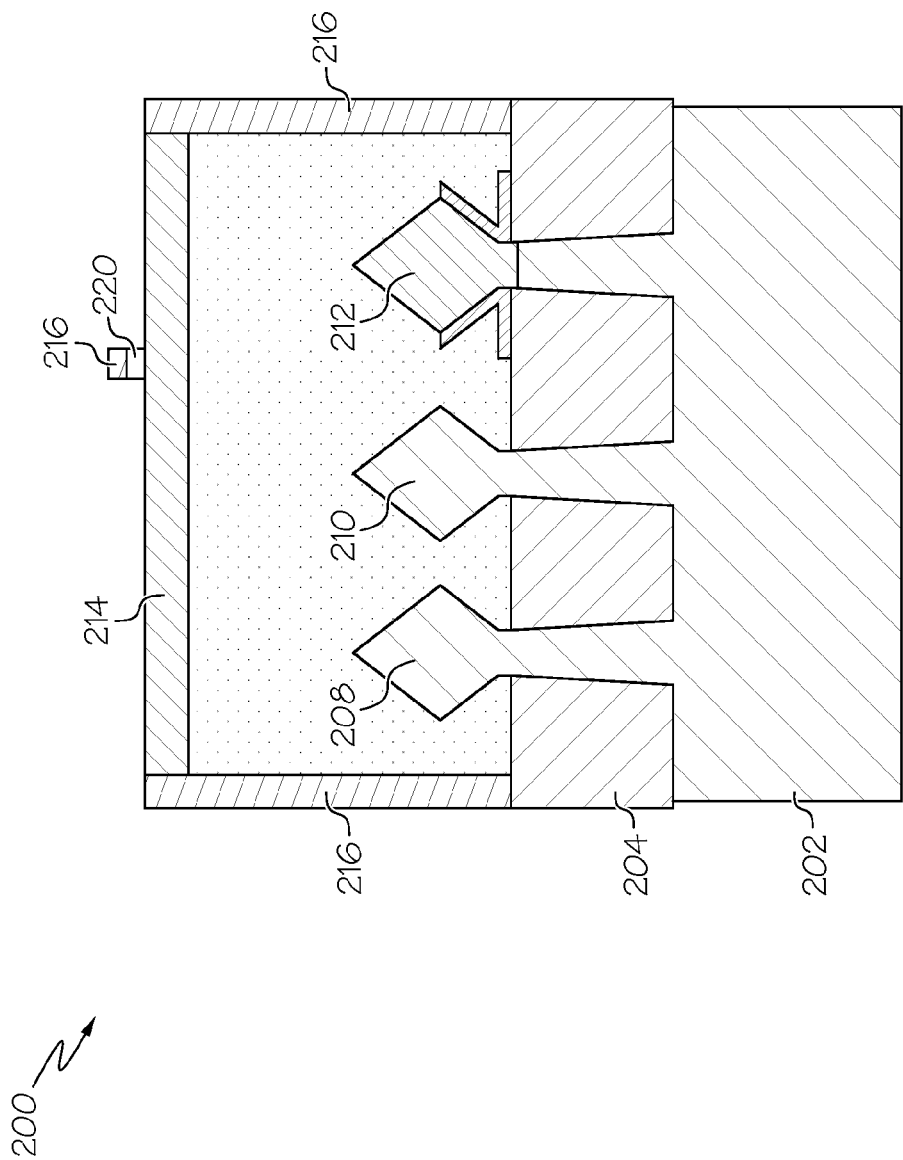
Figure 5:
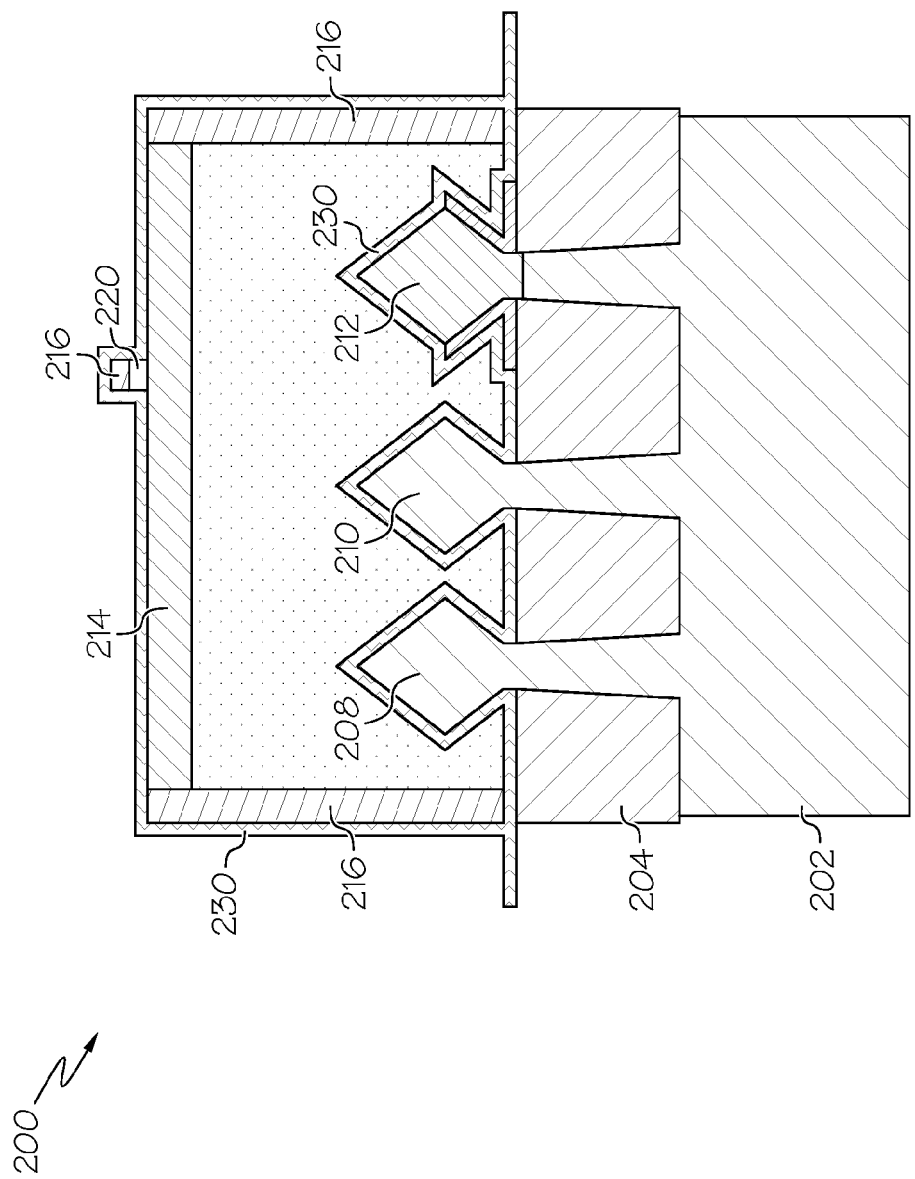
Figure 6:
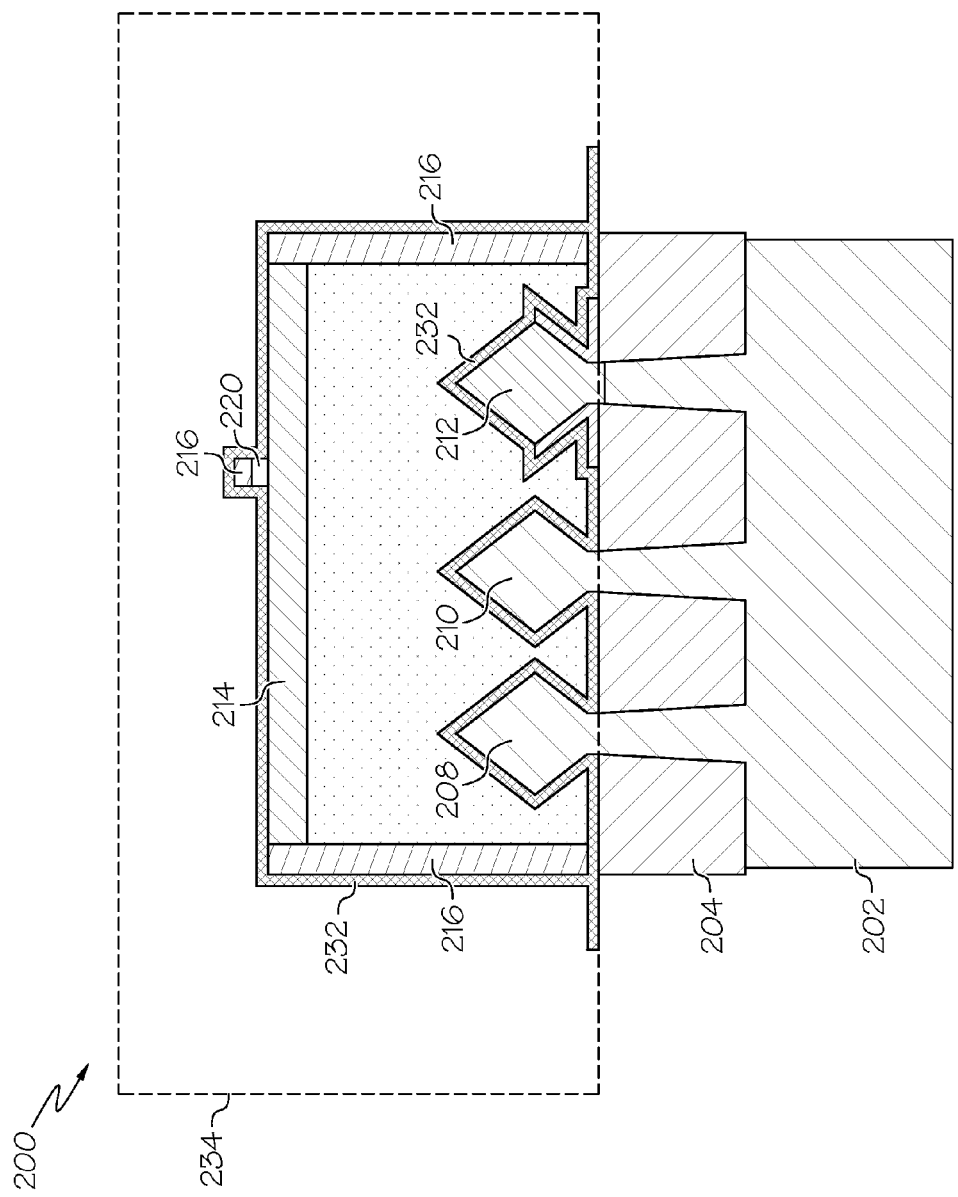

Features of this invention will be more readily understood from the following detailed description of the various aspects of the invention taken in conjunction with the accompanying drawings in which:

FIG. 1A is a semiconductor structure at a starting point for illustrative embodiments;

FIG. 1B is a top-down view of a semiconductor structure at a starting point for illustrative embodiments;

FIG. 2 is a semiconductor structure after a subsequent step of removing a portion of the contact etch stop layer, in accordance with illustrative embodiments;

FIG. 3 is a semiconductor structure after a subsequent step of depositing an oxide layer, in accordance with illustrative embodiments;

FIG. 4 is a semiconductor structure at a starting point for alternative illustrative embodiments;

FIG. 5 is a semiconductor structure after a subsequent step of depositing a silicon layer, in accordance with illustrative embodiments;

FIG. 6 is a semiconductor structure after subsequent steps of depositing a flowable oxide and performing an anneal, in accordance with illustrative embodiments;

FIG. 7 is a flowchart indicating process steps for illustrative embodiments; and FIG. 8 is a flowchart indicating process steps for alternative illustrative embodiments.

DETAILED DESCRIPTION

Exemplary embodiments will now be described more fully herein with reference to the accompanying drawings, in which exemplary embodiments are shown. Embodiments of the present invention provide improved methods for fabricating field effect transistors such as finFETs. Stressor regions are used to increase carrier mobility. However, subsequent processes such as deposition of flowable oxide and annealing can damage the stressor regions, diminishing the amount of stress that is induced. Embodiments of the present invention provide a protective layer of silicon or silicon oxide over the stressor regions prior to the flowable oxide deposition and anneal.

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer), is present on a second element, such as a second structure (e.g. a second layer), wherein intervening elements, such as an interface structure (e.g. interface layer), may be present between the first element and the second element.

FIG. 1A is a semiconductor structure 100 at a starting point for illustrative embodiments. Structure 100 comprises a substrate 102, which may be a silicon substrate, such as a bulk silicon substrate or silicon-on-insulator (SOI) substrate. A shallow trench isolation (STI) layer 104 is formed on substrate 102. STI layer 104 may be comprised of oxide, such as silicon oxide. Stressor regions 108, 110, and 112 are formed adjacent to gate 106, which may be comprised of polysilicon. Gate 106 may be a dummy gate that is later replaced with a metal gate during a replacement metal gate (RMG) process. FIG. 1B shows a top-down view, indicating the positioning of the stressor regions 108, 110, and 112 as adjacent to gate 106. In this exemplary embodiment, stressor regions 108 and 110 are N-type stressor regions, and may be comprised of silicon phosphorous (SiP). Stressor region 112 is comprised of silicon germanium (SiGe). A pad nitride layer 114 is formed over gate 106. In embodiments, pad nitride layer 114 is comprised of silicon nitride (SiN). Spacer layer 116 is formed adjacent to gate 106. In embodiments, spacer layer 116 may be comprised of nitride, such as silicon nitride. A small portion of cap oxide 120 is disposed on pad nitride layer 114. The spacer layer 116 may be disposed on the cap oxide 120 and on a portion of the pad nitride layer 114. The portion of spacer layer disposed on cap oxide 120 is referred to as a N/P overlap bump, which may be resulting from separate processing for PFETs and NFETs. A second spacer 122 may be formed over the P-type stressor region 112 to protect it during formation of N-type stressor regions 108 and 110. Contact etch stopping layer (CESL) 118 is deposited over the structure, including over the gate and over the stressor regions 108, 110, and 112. In some embodiments, CESL 118 may be deposited using an atomic layer deposition process.

FIG. 2 shows semiconductor structure 100 after a subsequent process step of removing a portion of the CESL 118 in accordance with illustrative embodiments. In embodiments, the removing of a portion of the CESL 118 may be performed with an anisotropic etch process, or with a wet etch process. As shown in FIG. 2, the CESL 118 is removed from the top of the pad nitride layer 114, and CESL 118 is also removed from a top portion of stressor regions 108, 110, and 112. A portion of the second spacer 122 is also removed from the top portion of P-type stressor region 112.

FIG. 3 shows semiconductor structure 100 after a subsequent step of depositing an oxide layer 124, in accordance with illustrative embodiments. In embodiments, the oxide layer 124 may be a silicon oxide layer. In some embodiments, the oxide layer 124 may have a thickness T1 ranging from about 50 angstroms to about 150 angstroms. In embodiments, the oxide layer 124 may be deposited by performing an In-situ Radical Assisted Deposition (IRAD) process. The oxide layer 124 serves to protect stressor regions 108, 110, and 112 during subsequent process steps, such as annealing, and deposition of flowable oxide. The flowable oxide may be used as an insulator region between the stressor regions 108, 110, and 112. From this point forward, industry standard techniques may be used to complete fabrication of the integrated circuit. These steps may include additional interlayer dielectrics, contacts, metallization layers, and packaging, among others.

FIG. 4 is a semiconductor structure 200 at a starting point for alternative illustrative embodiments. Structure 200 comprises a substrate 202, which may be a silicon substrate, such as a bulk silicon substrate or silicon-on-insulator (SOI) substrate. A shallow trench isolation (STI) layer 204 is formed on substrate 202. STI layer 204 may be comprised of oxide, such as silicon oxide. Stressor regions 208, 210, and 212 are formed adjacent (similar to as shown in FIG. 1B) to gate 206, which may be comprised of polysilicon. In this exemplary embodiment, stressor regions 208 and 210 are N-type stressor regions, and may be comprised of silicon phosphorous (SiP). Stressor region 212 is comprised of silicon germanium (SiGe). A pad nitride layer 214 is formed over gate 206. In embodiments, pad nitride layer 214 is comprised of silicon nitride (SiN). Spacer layer 216 is formed adjacent to gate 206. In embodiments, spacer layer 216 may be comprised of nitride, such as silicon nitride. A small portion of cap oxide 220 is disposed on pad nitride layer 214. The spacer layer 216 may be disposed on the cap oxide 220 and on a portion of the pad nitride layer 214. The portion of spacer layer disposed on cap oxide 220 is referred to as a N/P overlap bump, which may be resulting from separate processing for PFETs and NFETs. A second spacer 222 may be formed over the P-type stressor region 212 to protect it during formation of N-type stressor regions 208 and 210.

FIG. 5 shows semiconductor structure 200 after a subsequent step of depositing a silicon layer 230, in accordance with illustrative embodiments. Silicon layer 230 may be deposited via a chemical vapor deposition (CVD) process. In embodiments, silicon layer 230 may have a thickness T2 ranging from about 10 angstroms to about 50 angstroms. The silicon layer 230 serves to protect stressor regions 208, 210, and 212 during subsequent process steps, such as annealing, and deposition of flowable oxide.

FIG. 6 shows semiconductor structure 200 after subsequent steps of depositing a flowable oxide 234 and performing an anneal, in accordance with illustrative embodiments. The flowable oxide 234 covers the semiconductor structure 200, but is shown transparent so that other details can remain visible in FIG. 6. Flowable oxide 234 may be deposited via a flowable chemical vapor deposition (FCVD) process. Following the FCVD process, an anneal, such as a steam anneal, is performed. In some embodiments, the anneal may be performed for a duration ranging from about 20 minutes to about 5 hours. In some embodiments, the duration may range from about 90 minutes to about 150 minutes. In some embodiments, the anneal may be performed at a process temperature ranging from about 100 degrees Celsius to about 700 degrees Celsius. In some embodiments, the anneal may be performed at a process temperature ranging from about 400 degrees Celsius to about 600 degrees Celsius. The FCVD process and anneal can serve to oxidize silicon layer 230 (FIG. 5), converting it to a silicon oxide layer 232 as shown in FIG. 6. In this way, the stressor regions 208, 210, and 212 remain intact, and do not get oxidized themselves. If the stressor regions 208, 210, and 212 were to get oxidized, it would reduce the amount of material able to contribute to the stress, and hence, would adversely affect the device performance.

FIG. 7 is a flowchart 700 indicating process steps for illustrative embodiments. In process step 750, stressor regions are formed. The stressor regions may include formation of regions of silicon germanium (SiGe), silicon phosphorous (SiP), and silicon carbon phosphorous (SiCP). The stressor regions may be formed via an epitaxial process. In process step 752, a contact etch stopping layer (CESL) is deposited. This deposition may be performed via a chemical vapor deposition (CVD) process. In process step 754, a portion of the CESL is removed, exposing the upper portion of the stressor regions. In process step 756, a silicon oxide layer is deposited on the structure, including on the stressor regions. In process step 758, a flowable oxide is deposited. In process step 760, an anneal, such as a steam anneal, is performed.

FIG. 8 is a flowchart 800 indicating process steps for alternative illustrative embodiments. In process step 850, stressor regions are formed. The stressor regions may include formation of regions of silicon germanium (SiGe), silicon phosphorous (SiP), and silicon carbon phosphorous (SiCP). The stressor regions may be formed via an epitaxial process. In process step 852, a silicon layer is deposited on the structure, including on the stressor regions. In process step 854, a flowable oxide is deposited. In process step 856, an anneal, such as a steam anneal, is performed. As a result of process steps 854 and 856, the silicon deposited over stressor regions in process step 852 oxidizes, forming a silicon oxide layer that protects the stressor regions formed in process step 850.

As can now be appreciated, embodiments of the present invention provide improved fabrication methods for field effect transistors, such as finFETs. By protecting the stressor regions, the imparted stress is maximized, which increases carrier mobility, thereby improving device performance.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What claimed is:

1. A method of forming a semiconductor structure, comprising:
   forming a plurality of stressor regions adjacent to a gate;
   forming a contact etch stopping layer on the gate and plurality of stressor regions;
   removing a first portion of the contact etch stopping layer from a top portion of the gate and a top portion of each of the plurality of stressor regions, wherein a second portion of the contact etch stopping layer is at least partially retained on at least one side portion of the gate and at least one side portion of each of the plurality of stressor regions;
   depositing a silicon layer on the gate and plurality of stressor region;
   depositing a flowable oxide on the plurality of stressor regions; and
   performing an anneal on the semiconductor structure.

2. The method of claim 1, wherein forming a contact etch stopping layer comprises performing an atomic layer deposition process.

3. The method of claim 1, wherein forming a contact etch stopping layer comprises depositing a layer of silicon nitride.

4. The method of claim 1, wherein depositing a silicon layer comprises depositing a silicon layer having a thickness ranging from about 10 angstroms to about 50 angstroms.

5. The method of claim 4, wherein depositing a silicon layer is performed via a chemical vapor deposition process.

6. The method of claim 1, wherein performing an anneal comprises performing an anneal for a duration ranging from about 90 minutes to about 150 minutes.

7. The method of claim 1, wherein performing an anneal comprises performing an anneal at a process temperature ranging from about 100 degrees Celsius to about 700 degrees Celsius.

8. The method of claim 1, wherein forming a plurality of stressor regions adjacent to a gate comprises forming a silicon germanium region.

9. The method of claim 8, wherein forming a plurality of stressor regions adjacent to a gate comprises forming a silicon phosphorous region.

10. The method of claim 9, further comprising forming a spacer over the silicon germanium region prior to forming the silicon phosphorous region.

11. The method of claim 10, further comprising removing a portion of the spacer prior to forming the silicon phosphorous region.

12. A method of forming a semiconductor structure, comprising:
    forming a plurality of stressor regions adjacent to a gate;
    forming a contact etch stopping layer on the gate and plurality of stressor regions;
    removing a first portion of the contact etch stopping layer from a top portion of the gate and a top portion of each of the plurality of stressor regions, wherein a second portion of the contact etch stopping layer is at least partially retained on at least one side portion of the gate and at least one side portion of each of the plurality of stressor regions;
    depositing a silicon oxide layer on the gate and plurality of stressor regions;
    depositing a flowable oxide on the plurality of stressor regions; and
    performing an anneal on the semiconductor structure.

13. The method of claim 12, wherein forming a contact etch stopping layer comprises depositing a layer of silicon nitride.

14. The method of claim 12, wherein depositing a silicon oxide layer comprises depositing a silicon oxide layer having a thickness ranging from about 50 angstroms to about 150 angstroms.

15. The method of claim 12, wherein depositing a silicon oxide layer comprises performing an In-situ Radical Assisted Deposition (IRAD) process.

16. The method of claim 12, wherein performing an anneal comprises performing an anneal with a duration ranging from about 90 minutes to about 120 minutes.

17. The method of claim 12, wherein performing an anneal comprises performing an anneal at a process temperature ranging from about 400 degrees Celsius to about 600 degrees Celsius.

18. A method of forming a semiconductor structure, comprising:
    forming a plurality of stressor regions adjacent to a gate;

forming a contact etch stopping layer of silicon nitride on the gate and plurality of stressor regions using an atomic layer deposition process;

removing a first portion of the contact etch stopping layer from a top portion of the gate and a top portion of each of the plurality of stressor regions, wherein a second portion of the contact etch stopping layer is at least partially retained on at least one side portion of the gate and at least one side portion of each of the plurality of stressor regions;

depositing a silicon oxide layer on the gate and plurality of stressor regions;

depositing a flowable oxide on the plurality of stressor regions; and performing an anneal on the semiconductor structure.

19. The method of claim 18, wherein forming a plurality of stressor regions adjacent to a gate comprises forming a silicon germanium region.

20. The method of claim 19, wherein forming a plurality of stressor regions adjacent to a gate comprises forming a silicon phosphorous region.

\* \* \* \* \*